US006927608B1

(12) United States Patent
Chen et al.

(10) Patent No.: US 6,927,608 B1
(45) Date of Patent: Aug. 9, 2005

(54) LOW POWER LOW VOLTAGE DIFFERENTIAL SIGNALING DRIVER

(75) Inventors: Mingdeng Chen, College Station, TX (US); Michael A. Nix, Buda, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/655,637

(22) Filed: Sep. 5, 2003

(51) Int. Cl.$^7$ .............................................. H03K 3/00
(52) U.S. Cl. ...................................... 327/108; 327/112
(58) Field of Search .......................... 327/65–67, 89, 327/108–112; 330/258

(56) References Cited

U.S. PATENT DOCUMENTS

| 6,326,815 | B1 * | 12/2001 | Sim et al. ...................... 327/57 |
| 6,590,422 | B1 * | 7/2003 | Dillon ........................... 326/86 |
| 6,781,445 | B2 * | 8/2004 | Feldman ...................... 327/563 |

OTHER PUBLICATIONS

Shahriar Jamasb, A 622MHz Stand-alone LVDS Driver Pad in 0.18-um CMOS, IEEE, 3 Park Avenue, 17th Floor, New York, NY., 10016-5997, 2001, Conexant Systems and University of San Diego, San Diego, California.
Andrea Boni, LVDS I/O Interface for Gb/s-per-Pin Operation in 0.35-um CMOS, IEEE Journal Of Solid-State Circuits, Apr. 2001, vol. 36, No. 4, IEEE, 3 Park Avenue, 17th Floor, New York, NY., 10016-5997.

Boni, Andrea; "1.2-Gb/s True PECL 100K Compatible I/O Interface in 0.35-um CMOS," IEEE Journal of Solid State Circuits, vol. 36, No. 6, Jun. 2001, pp. 979-987, IEEE, 445 Hoes Lane, Piscataway, NJ 08854-1331,USA.
Djahanshahi, Hormoz; "Gigabit-per-Second, ECL-Compatible I/O Interface in -.35-um CMOS," IEEE Journal of Solid State Circuits, vol. 34, No. 8, Aug. 1999, pp. 1074-1083, IEEE, 445 Hoes Lane, Piscataway, NJ 08854-1331,USA.

* cited by examiner

Primary Examiner—Kenneth B. Wells
(74) Attorney, Agent, or Firm—Timothy Markison; LeRoy D. Maunu; Justin Liu

(57) ABSTRACT

A low power LVDS driver includes a switchable current module, a source termination circuit, a transistor section, and a load current source. The switchable current module is operably coupled to produce a first current when a differential input signal is in a first state and to produce a second current when the differential input signal is in a second state. The source termination circuit is operably coupled in parallel with a load. The transistor section is operably coupled to receive the first and second currents from the switchable current module via at least one of the source termination circuit and the load, wherein the transistor section produces an LVDS output signal based on the first and second currents, the differential input signal, and the source termination circuit. The load current source is operably coupled to sink the first and second currents from the transistor section.

29 Claims, 7 Drawing Sheets

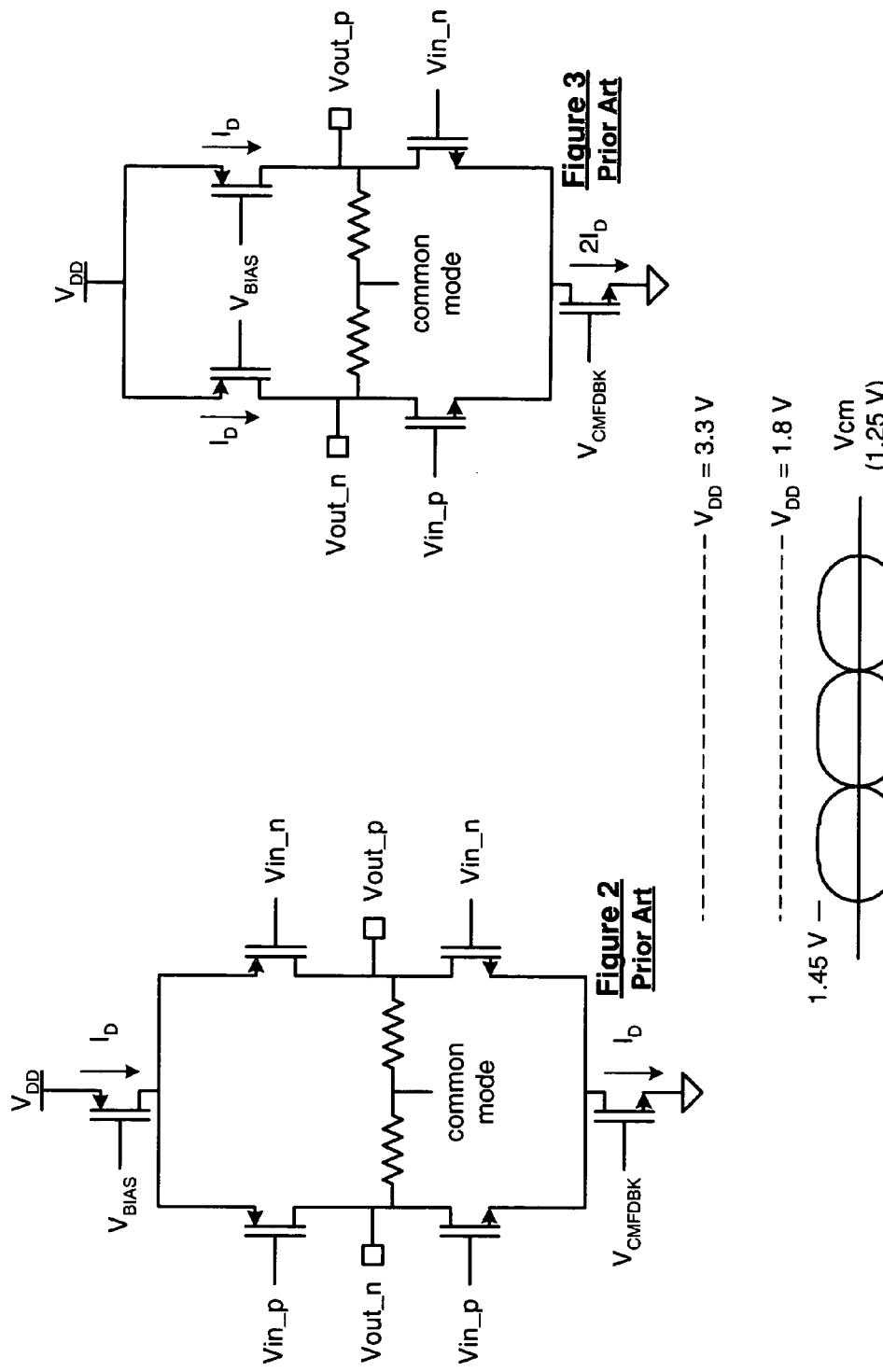

integrated circuit 10

LVDS driver 14 - 24

LVDS driver 14 - 24 active pull-up and pull-down circuit 60 and 62

LVDS driver 14 - 24

LVDS driver 14 - 24

LOW POWER LOW VOLTAGE DIFFERENTIAL SIGNALING DRIVER

FIELD OF THE INVENTION

This invention relates generally to data signaling and more particularly to low voltage differential signaling.

BACKGROUND OF THE INVENTION

As is known, low voltage differential signaling (LVDS) is a standardized data transmission format that is widely used for serial data transmissions. Such LVDS formatting is generally illustrated in FIG. 1. As shown in FIG. 1, a differential signal is centered about a common mode voltage of 1.25 volts. The magnitude of the differential signal is 0.4 volts. As such, with respect to ground, the LVDS signal varies in magnitude from 1.05 volts to 1.45 volts.

One common embodiment of an LVDS driver is illustrated in FIG. 2. As shown in FIG. 2, the LVDS driver includes a P-channel current source, two P-channel input transistors, two N-channel input transistors and an N-channel current source. In addition, the LVDS driver may include impedance matching resistors to provide a desired output impedance, for example the resistors may be 50 Ohm resistors. In operation, the P-channel input transistors and the N-channel input transistors steer the current produced by the P-channel current source ($I_D$) to a load via the output terminals (Vout_n and Vout_p) and the resistors to the N-channel transistor current source. As such, when the positive leg of the differential input signal (Vin_p) is high with respect to the negative leg (Vin_n) the current $I_D$ flows through the P-channel transistor with Vin_n as its gate input through the resistors and the load to the N-channel transistor with its gate coupled to Vin_p to the N-channel current source. When the negative leg of the differential signal input (Vin_n) is high with respect to the positive leg of the differential input signal (Vin_p), the current flows through the other pair of P and N-channel transistors.

The LVDS driver of FIG. 2 works well when the supply voltage ($V_{DD}$) is 3.3 volts or greater, which is common for 0.35 micron CMOS technology. But when the supply voltage drops below 2 volts (e.g., 1.8 volts for 0.18 micron CMOS technology), the LVDS driver of FIG. 2 does not have enough supply voltage headroom for the stacked P-channel transistors. For instance, with reference to FIGS. 1 and 2, as shown in FIG. 1, the signal swings from 1.05 volts to 1.45 volts in magnitude with reference to ground, centered at a common mode voltage of 1.25 volts. If, as allowed by the LVDS standard, the common mode voltage drifts to its upper limit (e.g., increases by 10%), it becomes 1.37 volts, which now raises the magnitude of the differential signal to range between 1.17 volts and 1.57 volts with respect to ground. With a 1.8 volt supply, there is only 0.23 volts of headroom for the drain-source voltage for two P-channel transistors, which is insufficient. This problem is further accentuated when the supply voltage is less than 1.8 volts (e.g., 1.6 volts, 1.1 volts, et cetera).

The LVDS driver of FIG. 3 overcomes the reduced power supply voltage issue by eliminating the stacked P-channel transistor configuration of the embodiment of FIG. 2. In the embodiment of FIG. 3, the LVDS driver includes 2 P-channel current source transistors, 2 N-channel input transistors and an N-channel current source transistor. In this embodiment the P-channel transistors function as fixed current sources to provide current to the load via the N-channel transistors, which are oppositely enabled based on the differential input signal. In this embodiment as shown, the N-channel current source is required to sink twice the current as the corresponding N-channel current source in the embodiment of FIG. 2. Accordingly, the embodiment of FIG. 3 consumes more power than the embodiment of FIG. 2. In addition, the N-channel input transistors are required to be significantly larger in die area than the corresponding N-channel transistors in the embodiment of FIG. 2. If an integrated circuit includes a plurality of LVDS drivers, the increased power consumption and increased die area requirement of the embodiment of FIG. 3 are unacceptable.

Therefore, a need exists for a low power LVDS driver that operates at very low supply voltages.

SUMMARY

The low power low voltage differential signaling (LVDS) driver of the present invention substantially meets these needs and others. In one embodiment, a low power LVDS driver includes a load current source, first and second input transistors, first and second switchable current sources, and a switchable current source control module. The load current source is operably coupled to provide a load current. The first input transistor includes a gate, a drain, and a source, wherein the source of the first input transistor is coupled to the load current source, and wherein the gate of the first input transistor is operably coupled to receive a first leg of a differential input signal. The second input transistor includes a gate, a drain, and a source, wherein the source of the second input transistor is coupled to the load current source, wherein the gate of the second input transistor is operably coupled to receive a second leg of the differential input signal, and wherein the drains of the first and second input transistors provide an output of the low power LVDS driver. The first switchable current source is operably coupled to the drain of the first input transistor and to a power supply source, wherein, when enabled, the first switchable current source provides a first current to the drain of the second input transistor via at least one of a source termination and a load. The second switchable current source is operably coupled to the drain of the second input transistor and to the power supply source, wherein, when enabled, the second switchable current source provides a second current to the drain of the first input transistor via the at least one of the source termination and the load. The switchable current source control module is operably coupled to selectively enable the first and second switchable current sources based on states of the first and second legs of the differential input signal. By selectively enabling the switchable current sources, this embodiment of an LVDS driver can operate from a low power supply voltage (e.g., 1.8 volts or less) and consumes minimal power.

In another embodiment, a low power LVDS driver includes a switchable current module, a source termination circuit, a transistor section, and a load current source. The switchable current module is operably coupled to produce a first current when a differential input signal is in a first state and to produce a second current when the differential input signal is in a second state. The source termination circuit is operably coupled in parallel with a load. The transistor section is operably coupled to receive the first and second currents from the switchable current module via at least one of the source termination circuit and the load, wherein the transistor section produces an LVDS output signal based on the first and second currents, the differential input signal, and the source termination circuit. The load current source is operably coupled to sink the first and second currents from the transistor section.

BRIEF DESCRIPTION OF THE DRAWINGS

FIG. 1 is a signaling diagram of an LVDS signal in accordance with a known standard;

FIG. 2 is a schematic block diagram of an LVDS driver as is known in the prior art;

FIG. 3 is a schematic block diagram of an alternate LVDS driver as is known in the prior art;

DETAILED DESCRIPTION

Figure 4:
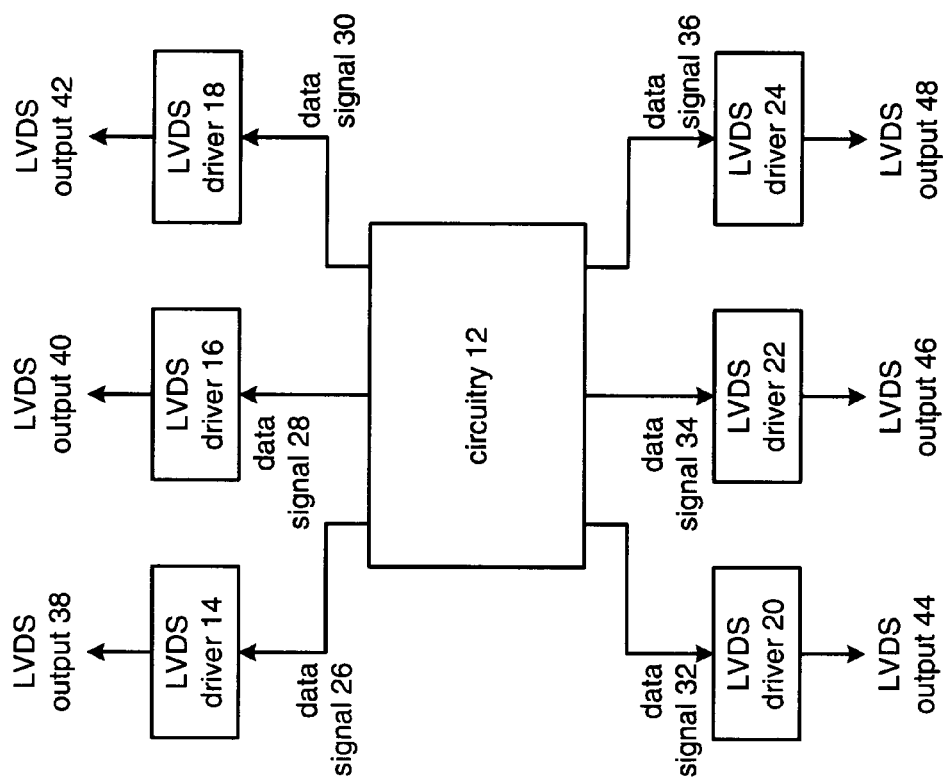
FIG. 4 is a schematic block diagram of an integrated circuit in accordance with the present invention.

FIG. 4 is a schematic block diagram of an integrated circuit 10 that includes circuitry 12 and a plurality of a low voltage differential signaling (LVDS) drivers 14–24. The circuitry 12 may be analog circuitry, digital circuitry, processing circuitry and/or memory that produce a plurality of data signals 26–36. The data signals may be analog or digital signals. For example, circuitry 12 may be a programmable logic device (such as a field programmable gate array or a complex programmable logic device) comprising programmable logic blocks, programmable I/O blocks, and a programmable interconnect structure. In some embodiments, the programmable I/O blocks may include one or more LVDS drivers, such as drivers 14–24. If the data signals 26–36 are digital signals, they may represent a serial data stream having a data rate in the hundreds of megabits-per-second to gigabits-per-second. Each of the LVDS drivers 14–24 receives a corresponding data signal 26–36 and produce a corresponding LVDS output 38–48. The LVDS output 38–48 will be in accordance with one or more versions of the LVDS specification.

Figure 5:
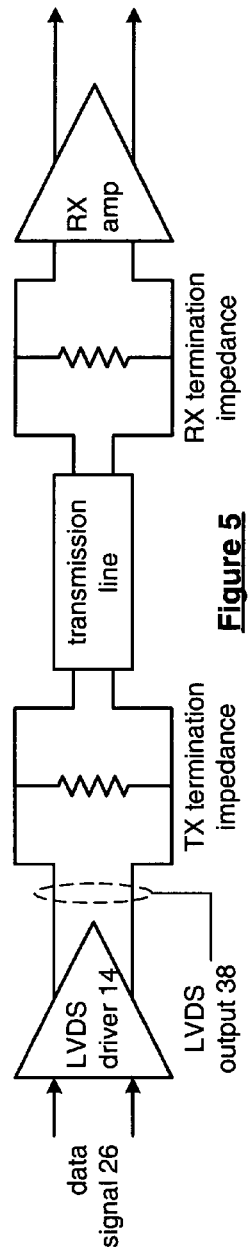
FIG. 5 is a schematic block diagram of an LVDS driver sourcing a load in accordance with the present invention.

FIG. 5 is a schematic block diagram of LVDS driver 14 providing its LVDS output 38 to a transmission line and subsequently to a receiver amplifier (RX amp). As is further shown, the output of the LVDS driver 14 includes a transmit termination impedance which may also be referred to as a source termination. This establishes the desired output impedance of the LVDS driver 14. The receiver amplifier may also include a receiver termination impedance to establish the input impedance of the receiver. In this illustration, the transmission line, receiver termination impedance and the receiver amplifier constitute a load for the LVDS driver 14.

Figure 6:
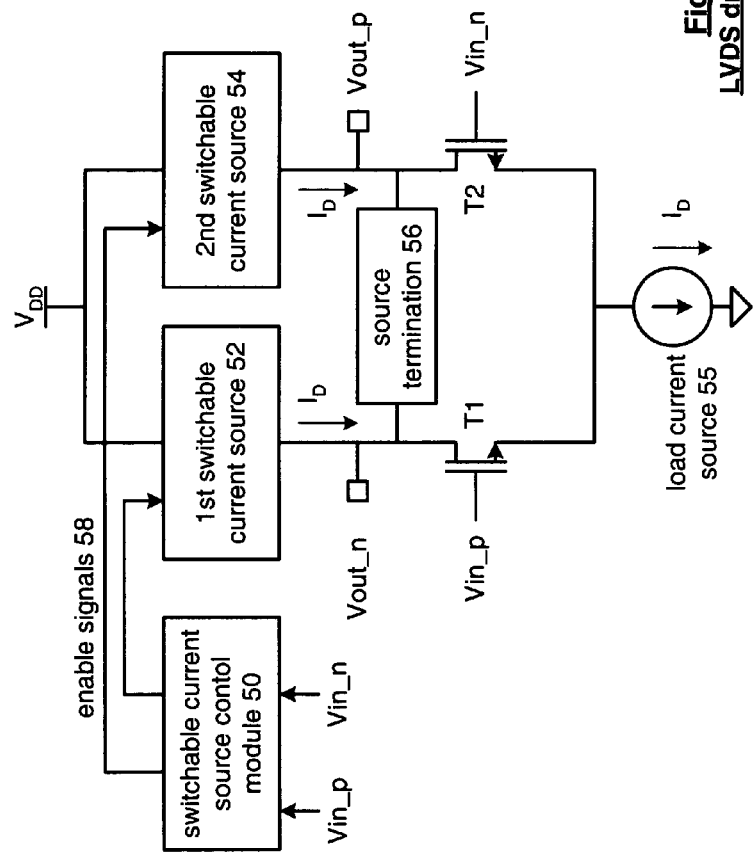
FIG. 6 is a schematic block diagram of an embodiment of an LVDS driver in accordance with the present invention.

FIG. 6 is a schematic block diagram of an embodiment of an LVDS driver 14–24. In this embodiment, the LVDS driver includes a switchable current source control module 50, a 1$^{st}$ switchable current source 52, a 2$^{nd}$ switchable current source 54, a source termination 56, two input transistors T1 and T2, and a load current source 55. The gates of the input transistors T1 and T2 are operably coupled to receive the positive (Vin_p) and negative (Vin_n) legs of a differential input signal. The switchable current source control module 50 also receives the positive and negative legs of the input signal.

In operation, the switchable current source control module 50 enables the 1$^{st}$ or 2$^{nd}$ switchable current source 52 or 54 via enable signals 58 based on the states of the positive and negative legs of the differential input signal. For instance, when the positive leg of the input signal (Vin_p) is at a magnitude greater than the negative leg of the differential input (Vin_n), the switchable current source control module 50 enables the 2$^{nd}$ switchable current source 54 to produce a current ($I_D$) In addition, with the positive leg being at a voltage greater than the negative leg, transistor T1 is on and transistor T2 is off. As such, the current produced by the 2$^{nd}$ switchable current source 54 is routed via the source termination 56 and/or via the load coupled to the output connections (Vout_p and Vout_n) to the drain of transistor T1. The current is routed via transistor T1 to the load current source 55. In this state, the 1$^{st}$ switchable current source 52 is disabled. As such, the load current source 55 only sinks the current produced by the 2$^{nd}$ switchable current source 54.

When the negative leg of the differential input signal (Vin_n) is at a voltage greater than the positive leg of the differential input signal (Vin_p), the switchable current source control module 50 enables the 1$^{st}$ switchable current source 52 and disables the 2$^{nd}$ switchable current source 54. In addition, transistor T2 is enabled and transistor T1 is disabled. Thus, the current produced by the 1$^{st}$ switchable current source 52 is routed to the drain of transistor T2 via the source termination 56 and/or via the load coupled to the output of the LVDS driver (Vout_n and Vout_p). The current through transistor T2 is then provided to the load current source 55. Thus, in comparison with the prior art LVDS drivers of FIGS. 2 and 3, the LVDS driver 14–24 of FIG. 6 may operate from a low power supply voltage (e.g., 1.8 volts or less) and consume less power since the load current source sinks less current.

Figure 7:
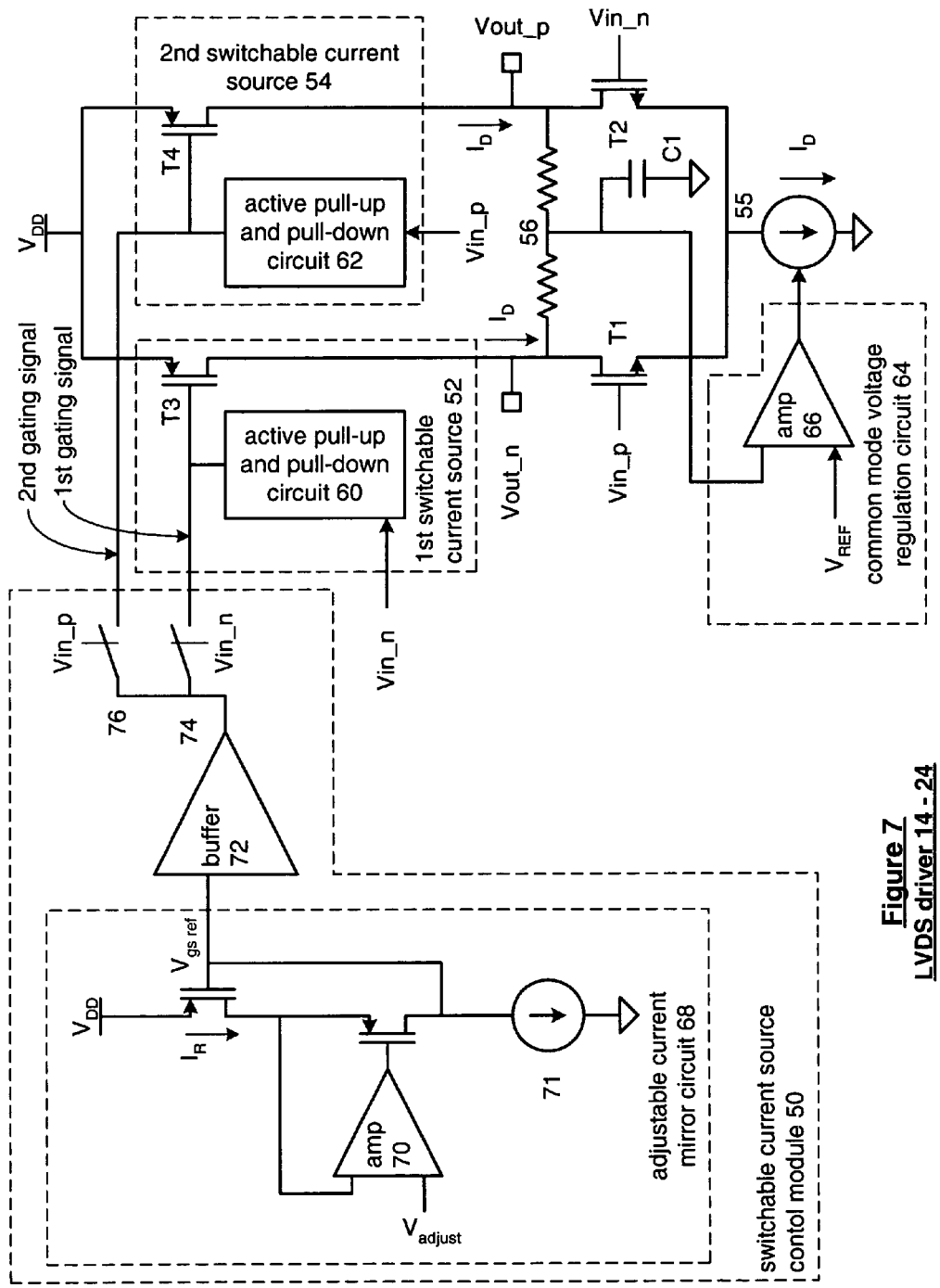
FIG. 7 is a schematic block diagram of an alternate embodiment of an LVDS driver in accordance with the present invention.

FIG. 7 is a schematic block diagram of an alternate embodiment of an LVDS driver 14–24 that includes the switchable current source control module 50, the 1$^{st}$ switchable current source 52, the 2$^{nd}$ switchable current source 54, input transistors T1 and T2, the source termination 56, which includes two resistors, the load current source 55, a capacitor C1, and a common mode voltage regulation circuit 64. The switchable current source control module 50 includes an adjustable current mirror circuit 68, a buffer 72, and two switches 74 and 76, which may be transistors. The adjustable current mirror circuit 68 includes two P-channel transistors, an amplifier 70, and a current source 71. Each of the 1$^{st}$ and 2$^{nd}$ switchable current sources 52 and 54 includes a P-channel transistor T3 or T4 and an active pull-up and pull-down circuit 60 or 62. The common mode voltage regulation circuit 64 includes an amplifier 66.

In operation, the adjustable current mirror circuit 68 generates a reference current ($I_R$) and a reference gate source voltage ($V_{gs\_ref}$). The buffer 72 buffers the reference gate source voltage and, via switch 74 or 76, provides it, as the first or second gating signal, to the gate of transistor T3 or T4. Accordingly, the reference current establishes the mirroring current for transistors T3 and T4. If the transistors T3 and T4 are of the same geometric size as the P-channel transistor in the adjustable current mirror circuit 68, the currents produced by transistors T3 and T4 will match the reference current. If the transistors are scaled in size, the currents will be correspondingly scaled.

The reference current, and hence the reference gate source voltage, may be adjusted by adjusting current source 71. For instance, if the current of current source 71 is reduced, the reference current is decreased and hence the gate source reference voltage is decreased. Conversely, if the current of current source 71 is increased, the reference current and the corresponding reference gate source voltage increase. As such, the drive currents produced by the LVDS driver can be adjusted to optimal levels based on the load requirements, thereby optimizing power consumption. In addition, the drain source voltage of the mirroring transistor of the adjustable current mirror circuit 68 can be adjusted to more closely match the drain source voltage of T3 and T4 by adjusting the input $V_{adjust}$ to the amplifier 70.

The common mode voltage regulation circuit 64, via amplifier 66, produces a control signal that regulates the load current source 55 such that the common mode voltage is maintained at a desired level (e.g., 1.25 volts). For example, the reference voltage ($V_{ref}$) may be set at 1.25 volts. The closed loop feedback system between the load current source 55, the resistors of the termination source 56 and the amplifier 66 regulates the common mode of the output to substantially match the reference voltage thereby maintaining the common mode voltage at 1.25 volts.

When the positive leg of a differential input signal (Vin_p) is of a magnitude larger than a magnitude of the negative leg of the differential input signal (Vin_n), transistor T1 is enabled, switch 76 is closed, switch 74 is open, and transistor T2 is off. With switch 76 closed and switch 74 opened, the corresponding active pull-up and pull-down circuit 62 and 60 of the $1^{st}$ and $2^{nd}$ switchable current sources 52 and 54 hold transistor T3 off and transistor T4 on. With transistor T4 on current flows through the resistors of termination source 56 and through the output load returning through transistor T1. Conversely, when the negative leg of the differential input signal (Vin_n) is of a magnitude greater than the magnitude of the positive leg of the differential input signal (Vin_p), switch 76 is open and switch 74 is closed such that transistor T3 is on and T4 is off. In addition, transistor T1 is off and transistor T2 is on such that the current flow is through transistor T3, the load in parallel with the termination source 56, input transistor T2, and the load current source 55. Accordingly, a low voltage differential signal is provided at the LVDS outputs (Vout_p and Vout_n).

Figure 8:
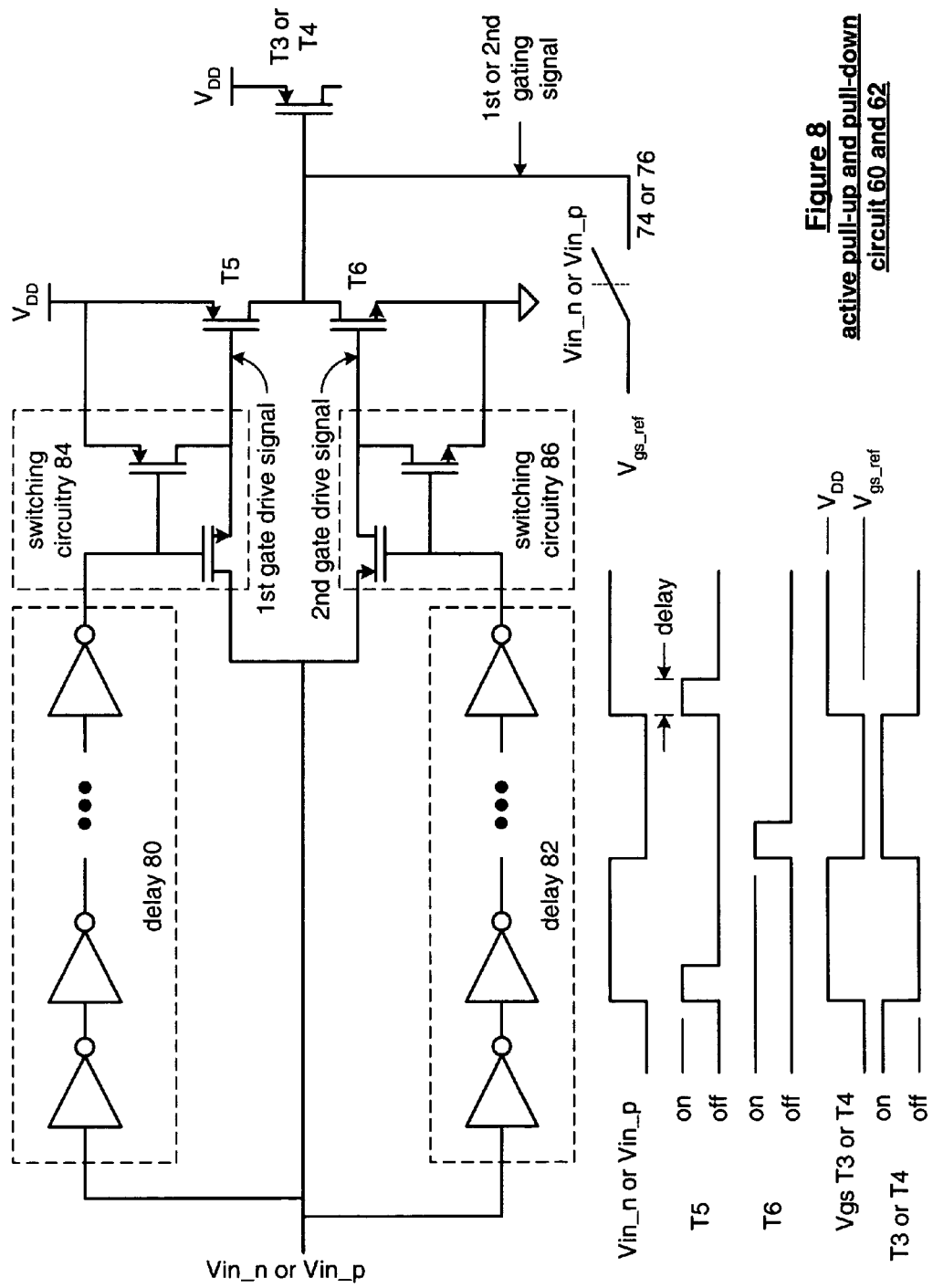
FIG. 8 is a schematic block diagram of an active pull-up and pull-down circuit in accordance with the present invention.

FIG. 8 is a schematic block diagram of the active pull-up and pull-down circuits 60 and 62 coupled to the gate of transistor T3 or T4, which is, in turn, coupled to switch 74 or 76. The circuit 60 or 62 includes two delay elements 80 and 82, switching circuitry 84 and 86, a P-channel transistor T5, and an N-channel transistor T6. The delay elements 80 and 82 may be comprised of a plurality of cascaded inverters or buffers (e.g., four or six inverters) that may be of the same size or different size such that delay 80 may provide the same delay or a different delay than that produced by delay 82.

The input of the pull-up and pull-down circuit is the positive or negative leg of the differential input signal (Vin_p or Vin_n) and is coupled to each of the delay elements 80 and 82 and to each of the switching circuitries 84 and 86. In operation, for pull-up and pull-down circuit 62, which is coupled to T4 and receives Vin_p as its input, transistors T5 and T6, respectively, are momentarily on to actively pull-up the gate voltage of transistor T4 to $V_{DD}$ when it is to be turned off and to actively pull-down the gate voltage of transistor T4 to ground when it is to be turned on. This can be better understood with reference to the accompanying voltage-timing diagram. As shown, when the input Vin_p transitions from low to high, transistor T5 is momentarily turned on via a first gate drive signal, where the duration for which T5 is on is established by delay 80, i.e., the first delayed signal. With transistor T5 on, transistor T4 is actively turned off. When transistor T5 turns off, the open switch 76 keeps transistor T4 off. Note that a resistive pull-up element may be included to assist with keeping transistor T4 off.

As is further shown, when the input Vin_p transitions from high to low, transistor T6 is momentarily turned on based on the second gate drive signal, where the duration for which T6 is on is established by delay 82, i.e., the second delayed signal. With transistor T6 on, transistor T4 is actively turned on. When transistor T6 turns off, the closed switch 76 keeps transistor T4 on.

Figure 9:
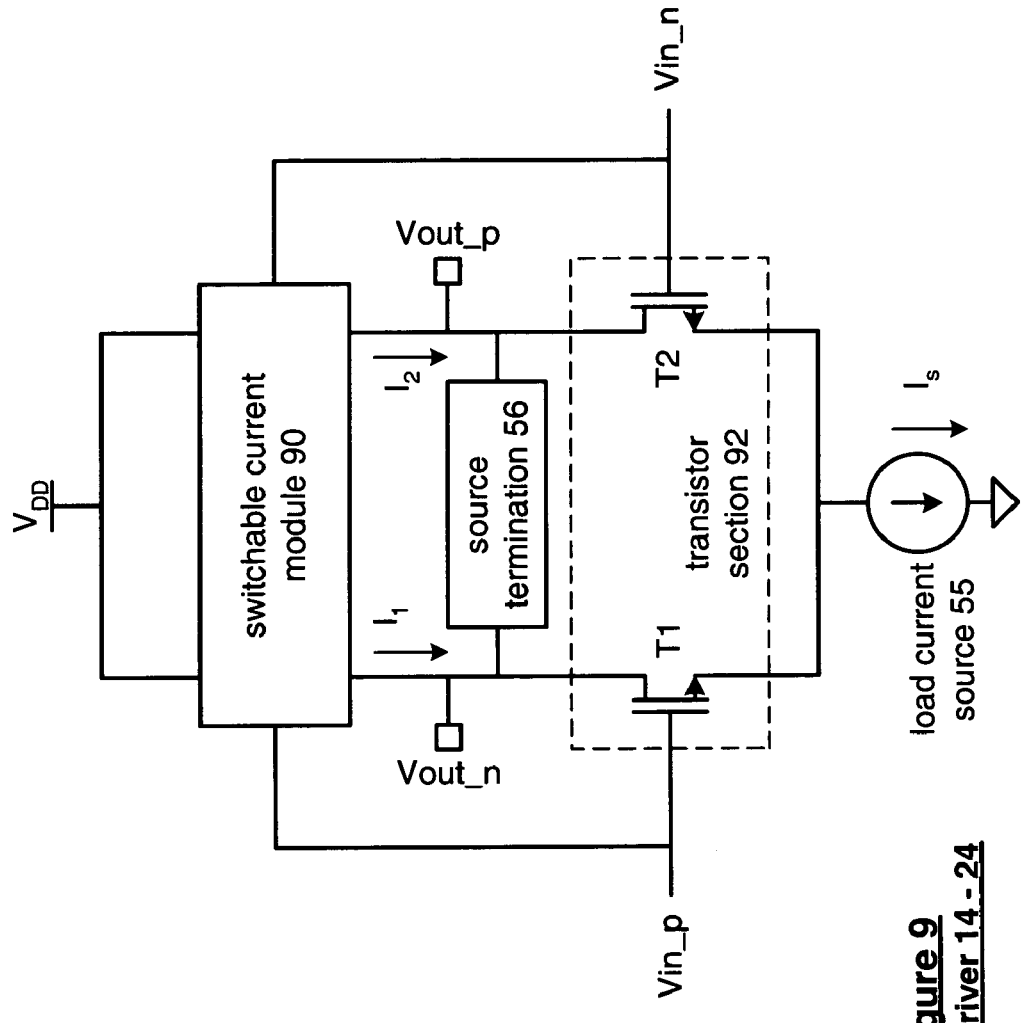
FIG. 9 is a schematic block diagram of another embodiment of an LVDS driver in accordance with the present invention.

FIG. 9 is a schematic block diagram of an alternate embodiment of a low voltage differential signaling (LVDS) driver 14–24. In this embodiment, the LVDS driver includes a switchable current module 90, the source termination 56, a transistor section 92 that includes transistors T1 and T2, and the load current source 55. The switchable current module 90 is operably coupled to produce a $1t$ current when the differential input signal is in a $1^{st}$ state (e.g., the positive input is greater than the negative input) and to produce a $2^{nd}$ current when the differential input signal is in a $2^{nd}$ state (e.g., when the negative leg is greater than the positive leg). When the positive input (Vin_p) is of a greater magnitude than the negative input (Vin_n), transistor T1 is on and transistor T2 is off, such that the $1^{st}$ current produced by the switchable current module 90 flows through source termination 56 and the load to input transistor T1 and to the load current source 55 to produce one state of the LVDS output. Conversely, when the positive input (Vin_p) is of a lower magnitude than the negative input (Vin_n), transistor T2 is on and transistor T1 is off, such that the $2^{nd}$ current produced by the switchable current module 90 flows through source termination 56 and the load to input transistor T2 and to the load current source 55 to produce another state of the LVDS output.

The LVDS driver of FIG. 9 may further include an amplifier operably coupled to the source termination 56 and to the load current source 55 to regulate the load current source 55 such that a desired common mode voltage for the differential output of the LVDS driver is maintained. The switchable current module 90 may be implemented utilizing a $1^{st}$ transistor operably coupled to produce the $1^{st}$ current based on a $1^{st}$ gating signal, a $2^{nd}$ transistor operably coupled to produce the $2^{nd}$ current based on a $2^{nd}$ gating signal and a gating module operably coupled to produce the $1^{st}$ and $2^{nd}$ gating signals based on the differential input signal and a reference gate voltage. The gating module may be implemented to include adjustable current mirror module and a pair of switches as illustrated in FIG. 7.

Figure 10:
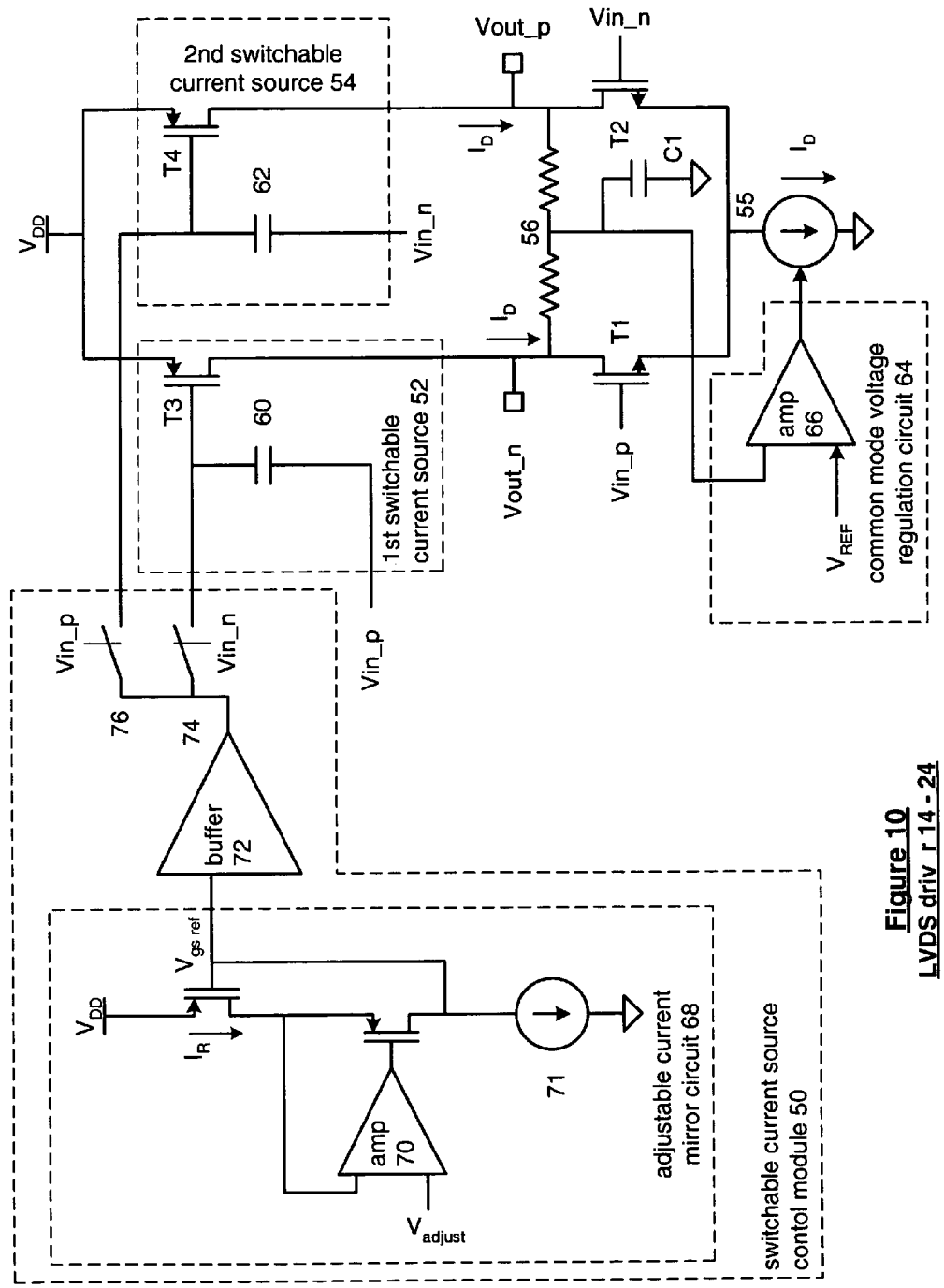
FIG. 10 is a schematic block diagram of yet another embodiment of an LVDS driver in accordance with the present invention.

FIG. 10 is yet another embodiment of the LVDS driver 14–24 that includes the switchable current source control module 50, the first switchable current source 52, the second switchable current source 54, input transistors T1 and T2, load current source 55, and the common mode voltage regulation circuit 64. This embodiment is similar to the embodiment of FIG. 7 with the exception that the active pull-up and pull-down circuit 60 and 62 is implemented via capacitors. In this embodiment, when Vin_p transitions high and Vin_n transitions low, switch 76 is closed and capacitor 62 momentarily pulls down on the gate voltage of transistor T4, thus actively enabling transistor 74. In addition, switch 74 opens and capacitor 60 momentarily pulls up on the gate voltage of transistor T3, thus actively turning off transistor T3.

When Vin_p transitions low and Vin_n transitions high, switch 76 is opens and capacitor 62 momentarily pulls up on the gate voltage of transistor T4, thus actively turning off transistor 74. In addition, switch 74 closes and capacitor 60 momentarily pulls down on the gate voltage of transistor T3, thus actively turning on transistor T3.

As one of average skill in the art will appreciate, the term "substantially" or "approximately", as may be used herein, provides an industry-accepted tolerance to its corresponding term. Such an industry-accepted tolerance may range, for example, from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a low power LVDS driver that may operate from low supply voltages (e.g., 1.8 volts or less). In addition, due to the low power consumption of the LVDS driver, multiple LVDS drivers may be included on a single integrated circuit with minimal power consumption consequences. As one of average skill in the art will appreciate, other embodiments may be derived from the teaching of the present invention without deviating from the scope of the claims.

What is claimed is:

1. A low power low voltage differential signaling (LVDS) driver deriving operational power from a common power supply node, the driver comprising:
   a load current source operably coupled to provide a load current;
   a first input transistor having a gate, a drain, and a source, wherein the source of the first input transistor is coupled to the load current source, and wherein the gate of the first input transistor is operably coupled to receive a first leg of a differential input signal;
   a second input transistor having a gate, a drain, and a source, wherein the source of the second input transistor is coupled to the load current source, and wherein the gate of the second input transistor is operably coupled to receive a second leg of the differential input signal, wherein the drains of the first and second input transistors provide an output of the low power LVDS driver;
   a first switchable current source operably coupled to the drain of the first input transistor and directly coupled to the common power supply node, wherein, when enabled, the first switchable current source provides a first current to the drain of the second input transistor via at least one of a source termination and a load;
   a second switchable current source operably coupled to the drain of the second input transistor and directly coupled to the common power supply node, wherein, when enabled, the second switchable current source provides a second current to the drain of the first input transistor via the at least one of the source termination and the load; and
   a switchable current source control module operably coupled to selectively enable the first and second switchable current sources based on states of the first and second legs of the differential input signal.

2. The low power LVDS driver of claim 1, wherein the first switchable current source comprises:
   a first P-channel transistor having a gate, a drain and a source, wherein the gate of the first P-channel transistor is operably coupled to receive a first gating signal from the switchable current source control module, the source of the first P-channel transistor is directly coupled to the common power supply node, and the drain of the first P-channel transistor is operably coupled to the drain of the first input transistor, wherein, when the first gating signal is in a first state, the first switchable current source is enabled; and
   a first active pull-up and pull-down circuit operably coupled to the gate of the first P-channel transistor to actively turn on and turn off the first P-channel transistor in accordance with the differential input signal and corresponding to the first gating signal.

3. The low power LVDS driver of claim 2, wherein the first active pull-up and pull-down circuit comprises:
   a pull-up module including:
     a first delay circuit operably coupled to delay the differential input signal to produce a first delayed signal;
     first switching circuitry operably coupled to produce a first gate drive signal in accordance with the first delayed signal; and
     a pull-up transistor operably coupled to pull-up a voltage of the gate of the first P-channel transistor based on the first gate drive signal; and
   a pull-down module including:
     a second delay circuit operably coupled to delay the differential signal to produce a second delayed signal;
     second switching circuitry operably coupled to produce a second gate drive signal in accordance with the second delayed signal; and
     a pull-down transistor operably coupled to pull-down a voltage of the gate of the first P-channel transistor based on the second gate drive signal.

4. The low power LVDS driver of claim 2, wherein the second switchable current source comprises:
   a second P-channel transistor having a gate, a drain and a source, wherein the gate of the second P-channel transistor is operably coupled to receive a second gating signal from the switchable current source control module, the source of the second P-channel transistor is directly coupled to the common power supply node, and the drain of the second P-channel transistor is operably coupled to the drain of the second input transistor, wherein, when the second gating signal is in the first state, the second switchable current source is enabled; and a second active pull-up and pull-down circuit operably coupled to the gate of the second P-channel transistor to actively turn on and turn off the second P-channel transistor in accordance with the differential input signal and corresponding to the second gating signal.

5. The low power LVDS driver of claim 4, wherein the second active pull-up and pull-down circuit comprises:
a pull-up module including:
a first delay circuit operably coupled to delay the differential input signal to produce a first delayed signal;
first switching circuitry operably coupled to produce a first gate drive signal in accordance with the first delayed signal; and
a pull-up transistor operably coupled to pull-up a voltage of the gate of the second P-channel transistor based on the first gate drive signal; and
a pull-down module including:
a second delay circuit operably coupled to delay the differential input signal to produce a second delayed signal;
second switching circuitry operably coupled to produce a second gate drive signal in accordance with the second delayed signal; and
a pull-down transistor operably coupled to pull-down a voltage of the gate of the second P-channel transistor based on the second gate drive signal.

6. The low power LVDS driver of claim 1 further comprising:
a common mode voltage regulation circuit operably coupled to the drains of the first and second input transistors and to the load current source, wherein the common mode voltage regulation circuit:
senses a common mode voltage based on voltages on the drains of the first and second input transistors to produce a measured common mode voltage;
compares the measured common mode voltage to a reference voltage;
generates a control signal based on the comparison of the measured common mode voltage to the reference voltage; and
provides the control signal to the load current source to regulate the load current to maintain a desired common mode voltage level.

7. The low power LVDS driver of claim 6, the source termination including:
a first resistor having a first node and a second node, wherein the first node of the first resistor is operably coupled to the drain of the first input transistor; and
a second resistor having a first node and a second node, wherein the first node of the second resistor is operably coupled to the drain of the second input transistor and the second node of the first resistor is operably coupled to the second node of the second resistor to provide a common mode sense node; and
the common mode voltage regulation circuit including:
an amplifier having a first input, a second input, and an output, wherein the first input is operably coupled to receive the reference voltage and the second input is operably coupled to the common mode sense node, wherein the output of the amplifier provides the control signal.

8. The low power LVDS driver of claim 1, wherein the switchable current source control module comprises:
an adjustable current mirror circuit operably coupled to produce a reference current and a reference gate voltage;
a buffer operably coupled to buffer the reference gate voltage to produce a buffered gate voltage;
a first switch operable to couple the buffered gate voltage to the first switchable current source when the first leg of the differential input is in a first state; and
a second switch operable to couple the buffered gate voltage to the second switchable current source when the second leg of the differential input is in the first state.

9. An integrated circuit comprising:
circuitry operable to produce a plurality of data signals;
an adjustable current mirror circuit operably coupled to produce a reference current and a reference gate voltage;
a buffer operably coupled to buffer the reference gate voltage to produce a buffered gate voltage; and
a plurality of low power low voltage differential signaling (LVDS) drivers, wherein each of the plurality of low power LVDS drivers includes:
a load current source operably coupled to provide a load current;
a first input transistor having a gate, a drain, and a source, wherein the source of the first input transistor is coupled to the load current source, and wherein the gate of the first input transistor is operably coupled to receive a first leg of a differential input signal that corresponds to one of the plurality of data signals;
a second input transistor having a gate, a drain, and a source, wherein the source of the second input transistor is coupled to the load current source, and wherein the gate of the second input transistor is operably coupled to receive a second leg of the differential input signal, wherein the drains of the first and second input transistors provide an LVDS output;
a first switchable current source operably coupled to the drain of the first input transistor and to a power supply source, wherein, when enabled, the first switchable current source provides a first current to the drain of the second input transistor via at least one of a source termination and a load;
a second switchable current source operably coupled to the drain of the second input transistor and to the power supply source, wherein, when enabled, the second switchable current source provides a second current to the drain of the first input transistor via the at least one of the source termination and the load;
a first switch operable to couple the buffered gate voltage to the second switchable current source when the first leg of the differential input is in a first state such that the second switchable current source is enabled; and
a second switch operable to couple the buffered gate voltage to the first switchable current source when the second leg of the differential input is in the first state such that the first switchable current source is enabled.

10. The integrated circuit of claim 9, wherein the first switchable current source comprises:
a first P-channel transistor having a gate, a drain and a source, wherein the gate of the first P-channel transistor is operably coupled to receive the buffered gate voltage via the first switch as a first gating signal, the source of the first P-channel transistor is operably coupled to the power supply source, and the drain of the first P-channel transistor is operably coupled to the drain of the first input transistor, wherein, when the first gating signal is in a second state, the first switchable current source is enabled; and a first active pull-up and pull-down circuit operably coupled to the gate of the first P-channel transistor to actively turn on and turn off the first P-channel transistor in accordance with the differential input signal and corresponding to the buffered gate voltage.

11. The integrated circuit of claim 10, wherein the first active pull-up and pull-down circuit comprises:
a pull-up module including:
a first delay circuit operably coupled to delay the differential input signal to produce a first delayed signal;
first switching circuitry operably coupled to produce a first gate drive signal in accordance with the first delayed signal; and
a pull-up transistor operably coupled to pull-up a voltage of the gate of the first P-channel transistor based on the first gate drive signal; and
a pull-down module including:
a second delay circuit operably coupled to delay the differential input signal to produce a second delayed signal;
second switching circuitry operably coupled to produce a second gate drive signal in accordance with the second delayed signal; and
a pull-down transistor operably coupled to pull-down a voltage of the gate of the first P-channel transistor based on the second gate drive signal.

12. The integrated circuit of claim 10, wherein the second switchable current source comprises:
a second P-channel transistor having a gate, a drain and a source, wherein the gate of the second P-channel transistor is operably coupled to receive the buffered gate voltage via the second switch as a second gating signal, the source of the second P-channel transistor is operably coupled to the power supply source, and the drain of the second P-channel transistor is operably coupled to the drain of the second input transistor, wherein, when the second gating signal is in the first state, the second switchable current source is enabled; and
a second active pull-up and pull-down circuit operably coupled to the gate of the second P-channel transistor to actively turn on and turn off the second P-channel transistor in accordance with the differential input signal and corresponding to the buffered gate voltage.

13. The integrated circuit of claim 12, wherein the second active pull-up and pull-down circuit comprises:
a pull-up module including:
a first delay circuit operably coupled to delay the differential input signal to produce a first delayed signal;
first switching circuitry operably coupled to produce a first gate drive signal in accordance with the first delayed signal; and
a pull-up transistor operably coupled to pull-up a voltage of the gate of the second P-channel transistor based on the first gate drive signal; and
a pull-down module including:
a second delay circuit operably coupled to delay the differential input signal to produce a second delayed signal;
second switching circuitry operably coupled to produce a second gate drive signal in accordance with the second delayed signal; and
a pull-down transistor operably coupled to pull-down a voltage of the gate of the second P-channel transistor based on the second gate drive signal.

14. The integrated circuit of claim 9, wherein each of the plurality of low power LVDS drivers further comprises:
a common mode voltage regulation circuit operably coupled to the drains of the first and second input transistors and to the load current source, wherein the common mode voltage regulation circuit:
senses a common mode voltage based on voltages on the drains of the first and second input transistors to produce a measured common mode voltage;
compares the measured common mode voltage to a reference voltage;
generates a control signal based on the comparison of the measured common mode voltage to the reference voltage; and
provides the control signal to the load current source to regulate the load current to maintain a desired common mode voltage level.

15. The integrated circuit of claim 14, the source termination including:
a first resistor having a first node and a second node, wherein the first node of the first resistor is operably coupled to the drain of the first input transistor; and
a second resistor having a first node and a second node, wherein the first node of the second resistor is operably coupled to the drain of the second input transistor and the second node of the first resistor is operably coupled to the second node of the second resistor to provide a common mode sense node; and
the common mode voltage regulation circuit including:
an amplifier having a first input, a second input, and an output, wherein the first input is operably coupled to receive the reference voltage and the second input is operably coupled to the common mode sense node, wherein the output of the amplifier provides the control signal.

16. A low power low voltage differential signaling (LVDS) driver deriving operational power from a common power supply node, the driver comprising:
a switchable current module directly coupled to the common power supply node to produce a first current when a differential input signal is in a first state and to produce a second current when the differential input signal is in a second state, wherein the switchable current module includes:
a first transistor directly coupled to the common power supply node to produce the first current based on a first gating signal; and
a second transistor directly coupled to the common power supply node to produce the second current based on a second gating signal;
a source termination circuit operably coupled in parallel with a load;
a transistor section operably coupled to receive the first and second currents from the switchable current module via at least one of the source termination circuit and the load, wherein the transistor section produces an LVDS output signal based on the first and second currents, the differential input signal, and the source termination circuit; and
a load current source operably coupled to sink the first and second currents from the transistor section.

17. The low power LVDS driver of claim 16, wherein the source termination circuit comprises:
a first resistor and a second resistor coupled in series, wherein a common node of the first and second resistors corresponds to a common mode voltage of the LVDS output signal.

18. The low power LVDS driver of claim 17 further comprising:
an amplifier having a first input, a second input, and an output, wherein the first input is operably coupled to receive a reference voltage and the second input is operably coupled to the common node of the first and second resistors, wherein the output of the amplifier provides a control signal to the load current source to regulate the load current such that common mode voltage of the LVDS output is maintained at a desired voltage level.

19. The low power LVDS driver of claim 16, wherein the switchable current module further comprises:
a gating module operably coupled to produce the first and second gating signals based on the differential input signal and a reference gate voltage.

20. The low power LVDS driver of claim 19, wherein the gating module comprises:
an adjustable current mirror module operably coupled to produce the reference gate voltage;
a first switch operable to couple the reference gate voltage to a gate of the first transistor as the first gating signal when the differential input signal is in the first state; and
a second switch operable to couple the reference gate voltage to a gate of the second transistor as the second gating signal when the differential input signal is in the second state.

21. The low power LVDS driver of claim 19, wherein the switchable current module further comprises:
a first pull-up pull-down circuit operably coupled to the first transistor to actively turn on and turn off the first transistor in accordance with the first gating signal; and
a second pull-up pull-down circuit operably coupled to the second transistor to actively turn on and turn off the second transistor in accordance with the second gating signal.

22. The low power LVDS driver of claim 16, wherein the switchable current module further comprises:
a first capacitor coupled between a gate of the first transistor and a first leg of the differential input signal; and
a second capacitor coupled between a gate of the second transistor and a second leg of the differential input signal.

23. An integrated circuit deriving operational power from a common power supply node comprising:
digital circuitry operable to produce a plurality of data signals; and
a plurality of low voltage differential signaling (LVDS) drivers operably coupled to drive the plurality of data signals, wherein each of the plurality of LVDS drivers includes:
a switchable current module directly coupled to the common power supply node to produce a first current when a differential input signal is in a first state and to produce a second current when the differential input signal is in a second state, wherein the differential input signal is a corresponding one of the plurality of data signals, the switchable current module including:
a first transistor directly coupled to the common power supply node to produce the first current based on a first patina signal; and a second transistor directly coupled to the common power supply node to produce the second current based on a second gating signal;
a source termination circuit operably coupled in parallel with a load;
a transistor section operably coupled to receive the first and second currents from the switchable current module via at least one of the source termination circuit and the load, wherein the transistor section produces an LVDS output signal based on the first and second currents, the differential input signal, and the source termination circuit; and
a load current source operably coupled to sink the first and second currents from the transistor section.

24. The integrated circuit of claim 23, wherein the source termination circuit comprises:
a first resistor and a second resistor coupled in series, wherein a common node of the first and second resistors corresponds to a common mode voltage of the LVDS output signal.

25. The integrated circuit of claim 24 further comprising:
an amplifier having a first input, a second input, and an output, wherein the first input is operably coupled to receive a reference voltage and the second input is operably coupled to the common node of the first and second resistors, wherein the output of the amplifier provides a control signal to the load current source to regulate the load current such that common mode voltage of the LVDS output is maintained at a desired voltage level.

26. The integrated circuit of claim 23, wherein the switchable current module further comprises:
a gating module operably coupled to produce the first and second gating signals based on the differential input signal and a reference gate voltage.

27. The integrated circuit of claim 23 further comprising:
an adjustable current mirror module operably coupled to produce the reference gate voltage for the plurality of LVDS drivers;
wherein the gating module of each of the plurality of LVDS drivers includes:
a first switch operable to couple the reference gate voltage to a gate of the first transistor as the first gating signal when the differential input signal is in the first state; and
a second switch operable to couple the reference gate voltage to a gate of the second transistor as the second gating signal when the differential input signal is in the second state.

28. The integrated circuit of claim 27, wherein the switchable current module further comprises:
a first pull-up pull-down circuit operably coupled to the first transistor to actively turn on and turn off the first transistor in accordance with the first gating signal; and
a second pull-up pull-down circuit operably coupled to the second transistor to actively turn on and turn off the second transistor in accordance with the second gating signal.

29. The low power LVDS driver of claim 23, wherein the switchable current module further comprises:
a first capacitor coupled between a gate of the first transistor and a first leg of the differential input signal; and
a second capacitor coupled between a gate of the second transistor and a second leg of the differential input signal.

* * * * *